United States Patent [19]

Shepard

[11] 3,944,736
[45] Mar. 16, 1976

[54] VOICE-OPERATED SWITCHING CIRCUIT FOR A VIDEO COMMUNICATIONS SYSTEM

[75] Inventor: Wayland L. Shepard, Liverpool, N.Y.

[73] Assignee: General Electric Company, Syracuse, N.Y.

[22] Filed: June 5, 1974

[21] Appl. No.: 476,431

[52] U.S. Cl. .......................... 178/6.8; 178/DIG. 1; 178/DIG. 20;
[51] Int. Cl.² .......................................... H04M 3/56
[58] Field of Search ....... 178/6.8, DIG. 1, DIG. 20, 179/1 SW, 1 VL, 2 TV, 18 BC, 1 H, 100.1 VC; 178/5.8 R, 5.6; 200/61.01; 340/148

[56] References Cited
UNITED STATES PATENTS

| | | | |
|---|---|---|---|
| 3,321,581 | 5/1967 | Zryd et al. | 179/1 VC |
| 3,519,744 | 7/1970 | Dorros | 179/2 TV |
| 3,601,530 | 8/1971 | Edson | 178/5.6 |
| 3,636,265 | 1/1972 | Kikuchi | 179/2 TV |
| 3,694,578 | 9/1972 | Reid | 179/1 CN |
| 3,755,625 | 8/1973 | Maston | 179/1 CN |
| 3,775,563 | 11/1973 | Klein | 179/2 TV |

Primary Examiner—Kathleen H. Claffy
Assistant Examiner—Joseph Popek
Attorney, Agent, or Firm—Robert J. Mooney

[57] ABSTRACT

In a video communications system for remotely located conference rooms, a voice-operated switching (VOX) circuit comprising:

1. an audio level discriminator (ALD) circuit for eliminating input audio signals below a predetermined magnitude and for locking out access to the VOX circuit when another VOX circuit is activated;
2. an audio duration control (ADC) circuit for controlling the activation of the VOX circuit and the possible loss of access to and preemption by another conferee during pauses between audio signals from any conferee presently having activated the VOX circuit and associated video system;
3. an attack time control (ATC) circuit for preventing short duration audio signals above the threshold level of the ALD circuit from activating the VOX circuit; and
4. an activation circuit for coordinating the output signals of the ALD, ADC, and ATC circuits and operating a video switcher in response to the aforesaid output signals.

3 Claims, 14 Drawing Figures

1

VOICE-OPERATED SWITCHING CIRCUIT FOR A VIDEO COMMUNICATIONS SYSTEM

BACKGROUND OF THE INVENTION

This invention relates to video communication systems for televising remotely located conference rooms and, more particularly, to improvements in voice-operated switching circuits for selective and automatic actuation of the system.

Audio or voice-operated switching circuits are known in the art and have a primary area of application, for example, in two-way video communications systems for connecting two or more groups of remotely located conferees to simulate a face-to-face meeting. The video systems are usually comprised of a plurality of cameras at each remote location (e.g., a conference room) directed toward the various conferee-speaking locations within the conference room. At each remote location one or more monitors, which are connectible to a plurality of cameras at the other remote locations, are available for viewing by each of the conferees or groups of conferees. In such applications, the voice-operated switching circuit is utilized to selectively and automatically activate the particular camera directed toward the location of the particular conferee-speaking at any particular time while maintaining unactivated the plurality of other cameras in each conference room and, thus, cause the video image of the particular speaker along with the audio signal to be transmitted to the various remote locations and there be reproducible on the respective monitor and audio speaker systems at each location. Such circuits usually function (1) to control the video switching selection when conferees at the same location speak simultaneously; (2) to maintain the camera system in operation without interruption even though the conferee makes short pauses between words and sentences; and (3) to prevent actuation of the switching circuit by background noise of a low audible level or of a short duration. One such system is described in U.S. Pat. No. 3,601,530. The design of the switching circuits in this system has been found to be highly complex and expensive.

Accordingly, it is an object of this invention to provide an improved switching circuit for a conference room video communications system.

It is another object of this invention to provide an electronically simple voice-operated switching system which utilizes a minimum number of expensive integrated-circuit components.

These and other objects will be apparent from the following description taken in conjunction with the appended claims.

SUMMARY OF THE INVENTION

In accordance with the invention herein, a video communications system comprises a plurality of cameras, a video switcher for automatically and selectively activating said cameras, and a plurality of voice-operated switching (VOX) circuits, each said VOX circuit comprising an audio level discriminator (ALD) circuit for eliminating input audio signals below a predetermined magnitude and for locking out access to other, and thus disabling, VOX circuits when one VOX circuit is activated; an audio duration control (ADC) circuit for controlling activation of the VOX circuits and for preventing the preemption of access to other VOX circuits by another conferee during pauses between audio signals from any one conferee who has already activated one VOX circuit; and an attack time control (ATC) circuit for preventing short duration audio signals above the threshold of the ALD circuit from activating a VOX circuit.

BRIEF DESCRIPTION OF THE PREFERRED EMBODIMENTT

Figure 1:
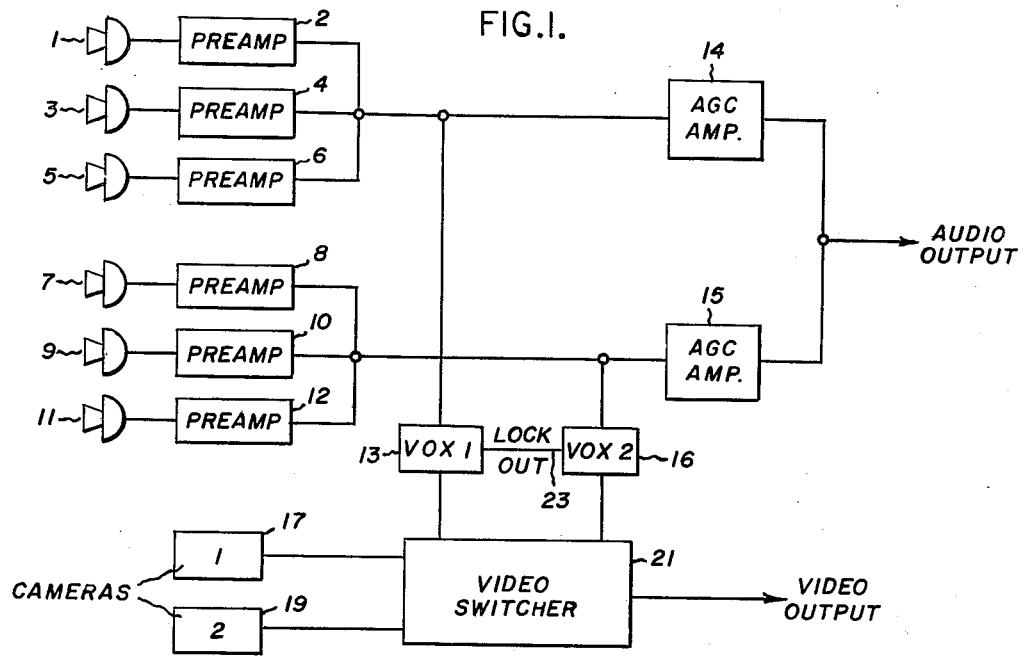
FIG. 1 is a schematic block diagram of a video communications system which utilizes voice-operated switching circuits constructed in accordance with the invention herein.

In FIG. 1, a video communications system is shown which utilizes voice-operated switching (VOX) circuits, in accordance with the invention herein, to control the video communications between the conference room in which it is intended to be installed and one or more other remotely located conference rooms is shown, each conference room having a plurality of speaking locations therein. The invention may be adequately illustrated by reference to two speaking locations per conference room. However, it will be understood by those skilled in the art that the invention has equal applicability to more than two locations as well as to more than two remotely located conference rooms.

In the system of FIG. 1, there is in each conference room a plurality of, preferably, directional microphones of any conventional type, for example three microphones 1, 3, 5 corresponding to a first speaking location in the conference room and three microphones 7, 9, 11 corresponding to a second speaking location in the same conference room. For each group of microphones there are one or more conferees who have access to these microphones. Corresponding to each group of microphones, there is one camera which will be actuated upon the speaking of one of the conferees into the group of microphones corresponding to this speaking location. The audio input into microphones 1, 3, 5 is transmitted to preamplifiers 2, 4, 6, respectively, for amplifications, and from there through automatic gain control amplifier 14 to the remote conference room by conventional means (not shown). Similarly, an audio input to microphones 7, 9, 11 is transmitted first to preamplifiers 8, 10, 12, respectively, and then through automatic gain control amplifier 15 to the remote location by conventional means (not shown). The audio signals from the same conference room are mixed to form a main audio output into the remote conference room. Desirably, the audio systems in both remotely located conference rooms are continuously operable irrespective of the location of the conferee speaking and the video image thereof being reproduced on all the monitors (not shown), in the respective locations, for viewing by the conferees. Alternatively however, as will be apparent to those skilled in the art, a switching circuit could be used to control selectively the activation of a portion or portions of the audio system.

A VOX circuit 13 cooperates with the first group of microphones 1, 3, 5 and a second VOX circuit 16 cooperates with the second group of microphones 7, 9, 11. A VOX circuit is required for each speaking location among which selection is desired. Which VOX circuit is first actuated depends on which conferee speaks first. The audio signal generated by the conferee is picked up by the microphones corresponding to the location of the conferee and transmitted to the corresponding VOX circuit. The output of the VOX circuit is then transmitted to a video switcher 21. The video switcher 21, which controls the operation of the respective cameras 17 and 19 in accordance with conventional switching techniques, which techniques form no part of the invention herein, then activates the appropriate camera.

The respective VOX circuits 13, 16 are connected by a lead 23 which, when one of the VOX circuits is in an activated state and has switched on the camera corresponding thereto, preempts the actuation of the remaining VOX circuit(s). That is to say, only one camera can be operated at a time.

Figure 2:
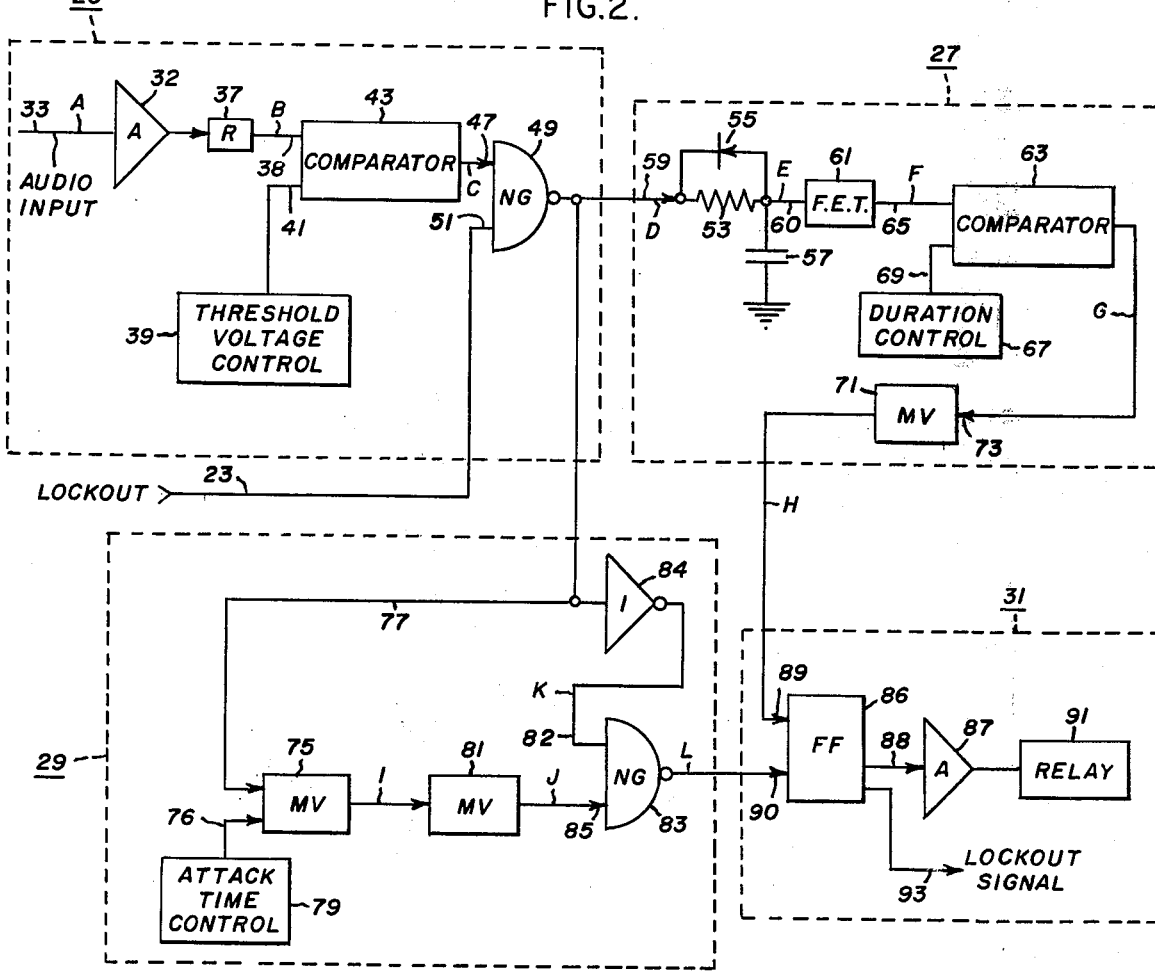
FIG. 2 is a detailed, schematic block diagram of one of the voice-operated switching circuits shown in FIG. 1.

In FIG. 2, a detailed, schematic block diagram is shown of a VOX circuit such as the circuits 13 and 16 of FIG. 1, each of which is identical in construction. As has been stated, the VOX circuit controls the selective actuation of one of a plurality of cameras in response to audio signals generated by conferees at a corresponding one of the locations.

The VOX circuit 13 is comprised of an audio level discriminator (ALD) circuit 25 which is responsive only to an audio signal above a predetermined magnitude. This aids in isolating or preventing the inadvertent activation of the VOX circuit 13 due to background noise below the predetermined minimum level. As will be explained in more detail below, the speaker who speaks first in time activates the video system camera viewing his particular location via the VOX circuit corresponding to his particular location and can maintain control over the video system so long as he continues to speak. The VOX circuit 13 generates a signal which is transmitted to the remaining VOX circuit(s) such as VOX circuit 16 via line 23 to preempt or "lock out" another conferee at a remote location from acquiring control over the video system by activation of the particular VOX circuit corresponding to his location.

The ALD circuit 25 is coupled to an audio duration control (ADC) circuit 27 which prevents the video system from being switched to another conferee who speaks or starts to speak at another speaking location within the conference room during lapses or pauses in the speaking of the conferee having control over the video system, via his VOX circuit, at any particular time. The output of the ALD circuit 25 is further coupled to an attack time control (ATC) circuit 29 which prevents short duration noise, for example, tapping on a conference table with a pencil, from actuating any VOX circuit. That is to say, circuit 25 requires an audio signal of greater than a predetermined duration before actuation of VOX circuit 13 in response thereto is possible. The output of ADC circuit 27 and ATC circuit 29 are combined in an activation circuit 31. Thus, the outputs of the three component circuits 25, 27, 29 which respond to audio signals which are above a predetermined audio level and beyond a predetermined time duration are combined in the circuit 31 to provide an input signal to the video switcher 21 which will, in turn, provide an output to activate the corresponding camera.

Figure 3:
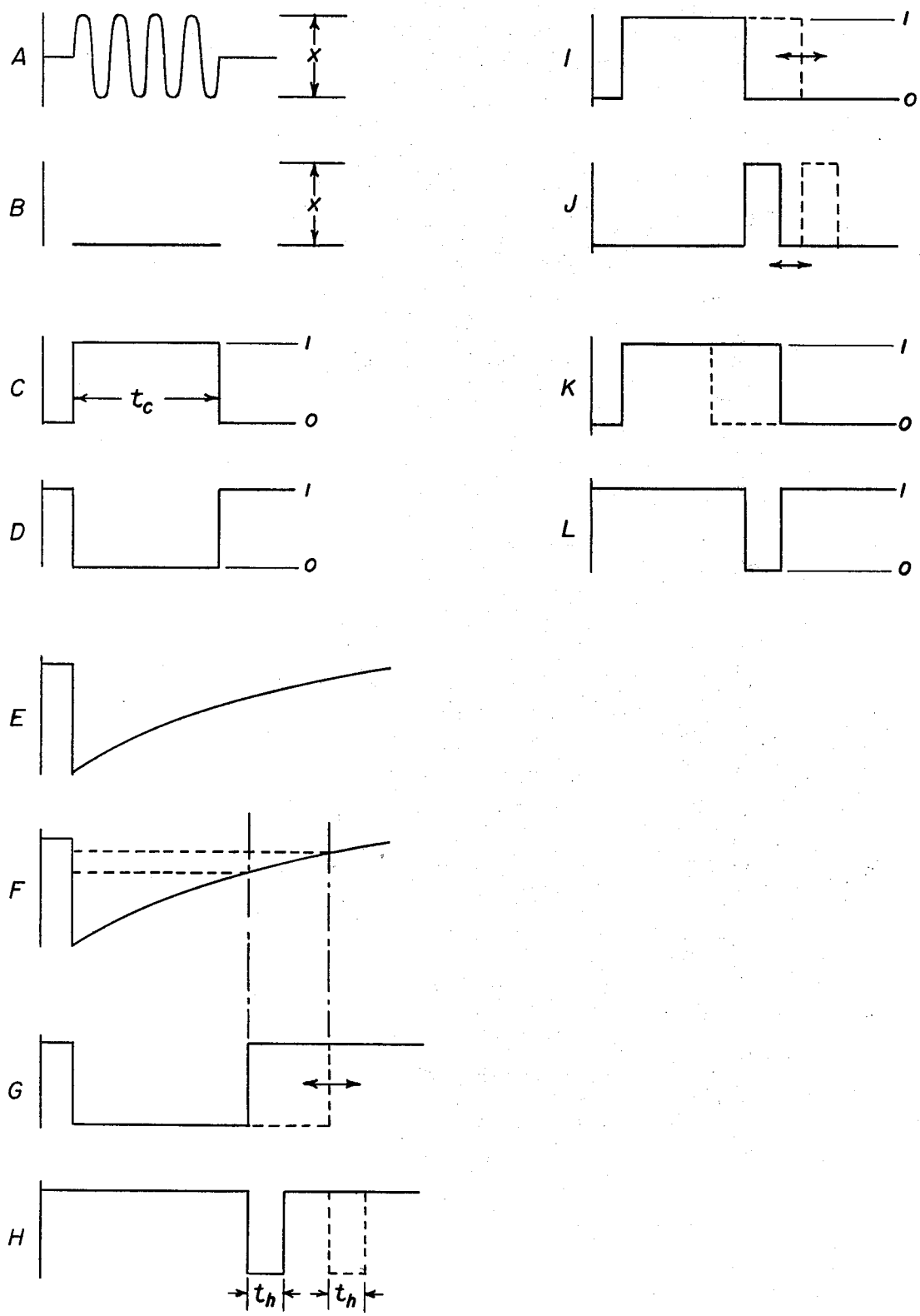
FIG. 3, comprised of A–L, is a graphical illustration of the wave forms at denoted points in the voice-operated switching circuit of FIG. 2.

Reference is now made to FIGS. 2 and 3 for a detailed explanation of the block diagram and the wave forms which are generated by each of the subcomponents.

FIG. 3 shows a qualitative graphical illustration, for explanatory purposes only, of the wave forms, as a function of time, produced at each transmission stage of a signal through an exemplary one of the VOX circuits, for example the VOX circuit 13. The leading and trailing edges of the wave forms are shown on the left and right, respectively, of each graph. The alphabetized sections of FIG. 3 correspond to the alphabetical denotations in FIG. 2.

The ALD circuit 25 is comprised of a bridging input operational amplifier 32 which has an input terminal 33 for coupling to the balanced output of the microphone or audio pickup system in the various conference room locations. The amplifier 32 may be of any conventional type such as Fairchild No. 741. The audio input signal to ALD circuit 25, which can be represented by a sine wave (FIG. 3A) is amplified by an amplifier 32. A full-wave rectifier 37 is coupled to the output of amplifier 32 for producing a rectified DC voltage proportional to the amplitude — peak to peak — of the audio input signal (FIG. 3B). The output of the rectifier 37 is supplied to a differential comparator 43 of any conventional type such as Fairchild No. 210 via a first input terminal 38 thereof. The DC input to terminal 38 is electronically compared with a predetermined threshold voltage which is determined by the setting of a threshold voltage control 39 connected to a second input terminal 41 of the comparator 43. Accordingly, a DC voltage input to terminal 38 below a predetermined level will be preempted from activating the comparator 43. The audio input signal has been converted at this point from an analog signal to a digital signal. That is, a digital 0 is produced when the input signal supplied to the input terminal 38 is below the predetermined threshold voltage and when the input signal is equal to or greater than the predetermined threshold voltage, a digital 1 is produced and supplied to a NAND gate 49 via a first input terminal 47.

The pulse width $t_c$ of the digital 1 output (FIG. 3C) generated by comparator 43 and supplied to NAND gate 49 is determined by the duration of the audio signal (FIG. 3A, e.g., the audio signal produced by pronouncing one word) supplied to the audio input of the amplifier 32.

The amplitude of the digial 1 pulse is constant and predetermined (e.g., 5 volts) by the comparator 43 for inputs above the threshold voltage set on control 39. Gate 49 has a second input terminal 51 which receives a digital output signal from the VOX circuit 16 corresponding to other speaking locations within the conference room, a digital 0 being indicative of the present activation of another VOX circuit 16 by a speaker remote from the location corresponding to the illustrated VOX circuit 13 (FIG. 2). Accordingly, when digital 1 and digital 0 inputs are supplied to terminals 47, 51, respectively, the output at D will be a digital 1; and when the inputs are both digital 1's, the output of gate 49 will be a digital 0, as shown in FIG. 2D. Thus, NAND gate 49 serves two functions: (1) to invert the digital output; and (2) to lock out access to the VOX circuit 13 (FIG. 2) when the video system is in use by another conferee at other speaking locations within the conference room.

In summary, ALD circuit 25 controls the access of a speaker to the VOX circuit 13 and the camera corresponding thereto (1) by eliminating audio signals below a predetermined threshold; and (2) by being locked out or nonresponsive to any audio input when another VOX circuit 16 is activated.

The digital output of the ALD circuit 25 is transmitted to the ADC circuit 27 via an input lead 59. As previously stated, the ADC circuit controls the activation of the VOX circuit and prevents the preemption by another conferee during pauses between audio signals from any conferee already having activated the VOX circuit 13 and associated video system. The ADC circuit 27 is comprised of a resistor 53 and capacitor 57, the combination of which integrates the input signal D supplied via lead 59. A diode 55 is coupled across the resistor 53, which diode 55 permits the leading edge of the negative-going pulse (FIG. 3D) to be short-circuited around the resistor 53 and to remain unintegrated. The time constant of the resistor 53 and capacitor 57 combination, as will be apparent to those skilled in the art, determines the integrated duration of the pulse output (FIG. 3E). The integrated output is transmitted to an input terminal 60 of a field effect transistor 61 which provides a low impedance input into a differential comparator 63, which may be of the same type as comparator 43, via an input terminal 65. A duration control 67 is connected to a second input terminal 69. The duration control 67 can be adjusted to predetermine the pulse width of the output (FIG. 3G) supplied from comparator 63. This can be seen in FIG. 3F, wherein the dotted lines represent two exemplary threshold voltages which can be set on the control 67. The resulting pulse widths of the output from comparator 63 are shown in FIG. 3G. As will be apparent, if the integrated pulse is more negative than the threshold voltage, the comparator 63 output will be a digital 0; and when the pulse is less negative than the threshold voltage, the output from the comparator 63 will be a digital 1. The duration control 67 is always set in accordance with foregoing conditions to yield a digital 0 output when an output signal is received from the ALD circuit 25. The pulse output of the comparator 63 is then supplied to a monostable multivibrator (MV) 71 via an input terminal 73. The MV 71 may be of any conventional construction such a Motorola No. MC851. The output pulse (FIG. 3H) of MV 71 is triggered by the trailing edge of the input pulse generated from the comparator 63. The pulse width $t_h$ (FIG. 3H) is determined by the external RC time constant of control 67. As can be seen, because the pulse (FIG. 3H) generated by the monostable MV 71 is triggered by the trailing edge of its input pulse (FIG. 3G), the time of the pulse will be determined by the adjustment of threshold voltage control 67. Accordingly, the adjustment of the threshold voltage control 67 can be used to adjust the length of time that the VOX circuit 13 continues the activation of the corresponding camera and thus be responsive to the conferee speaking at that location when the conferee pauses or stops speaking.

The output from ALD circuit 25 is also supplied to ATC circuit 29 via lead 77. As has been stated, the ATC circuit prevents short duration audio signals above the threshold level of control 29 from activating the VOX circuit 13. The first stage of ATC circuit 29 is a monostable MV 75 which has an attack time control 79 for adjusting and determining the duration or pulse width of the digital signal generated thereby. The control 79 is comprised of a resistor-capacitor circuit (not shown) to provide an external adjustable RC time constant for reset input 76. The output of the MV 75 (FIG. 3I) is coupled to the input of a second monostable MV 81. The MV's 75, 81 may be of any conventional construction such as Motorola No. MC851. The pulse width of the output of the MV 81 is fixed, but the time of the pulse is determined or delayed by the variation of the pulse width of the MV 75, the trailing edge of the pulse (FIG. 3I) generated by MV 75 being used to trigger MV 81. The output of the MV 81 is connected to NAND gate 83 via a first terminal 85.

Additionally, the output (FIG. 3D) of ALD circuit 25 is coupled to a second terminal 82 of gate 83 through an inverter 84. If the duration of the pulse (FIG. 3K) (remembering that the pulse width thereof is proportional to the duration of the original audio signal (FIG. 3A) is shorter than the delay time fixed by MV 75, then the digital signals (pulses) will be non-coincidental and non-overlapping in time (as shown by a first example which is represented by the dotted lines, FIGS. 3J, K) and, accordingly, the output from NAND gate 83 will be a digital 1. If, on the other hand, the pulse width (FIG. 3K) is longer than the delay time (as shown by a second example which is represented by the solid lines, FIGS. 3J, K), the digital output of gate 83 (FIG. 3L) will be a digital 0 because at least a portion of the pulses will be coincident at the gate 83.

In summary, it can be seen that the ATC circuit 29 will generate a digital output indicative of whether an audio input signal (FIG. 3A) is less than or greater than or equal to a predetermined adjustable standard duration. Accordingly, as will be explained hereinbelow, the VOX circuit 13 can be made to be nonresponsive to audio input signals less than the predetermined minimum duration.

The output of the ATC circuit 29 is coupled to a flip-flop 86 via a set input terminal 90, and the output of ADC circuit 27 is coupled to a clear input terminal 89 of flip-flop 86, the flip-flop 86 being the first stage of the activation circuit 31. The flip-flop 86 may be of any conventional construction such as Motorola No. MC848. The flip-flop 86 is designed such that it can only be triggered by a digital 0. Thus, in the first case, when the output of ATC circuit 29 is a digital 1 — which corresponds to when the audio input signal (FIG. 3A) is less than the predetermined duration — the flip-flop 86 will not initiate a switching function. Accordingly, in the second case when the output of the ATC circuit 29 is a digital 0 (FIG. 3L)—which corresponds to when the audit input signal is greater than or equal to the predetermined duration — the flip-flop 86 will be triggered and will remain activated until it is cleared or terminated by the digital 0 output pulse (FIG. 3H) generated by the ADC circuit 27 (assuming that audio signal A having the proper parameters set forth hereinbefore has been received by the VOX circuit 13). An amplifier 87, which is connected to an output lead 88 of flip-flop 86, is turned on to transmit an amplified output for the duration of the pulse generated by flip-flop 86 and is turned off between such pulses. The output of the amp 87 can be used to energize a relay 91 of any other similar conventional electromechanical and electronic system to perform the various switching operations required by the video switcher 21 to actuate the video system in accordance with the location of the source of the input audio signal A.

When the VOX circuit 13 has been activated to provide a switching input signal to the video switcher 21, all the remaining VOX circuits are locked out, i.e., preempted from actuation by a digital 0 generated by the flip-flop 86 at a second output terminal 93 during interval of time between the reception of a set input pulse and a clear input pulse by the flip-flop 86. The terminal 93 is connected to the second input terminal 51 of NAND gate 49 (via, e.g., line 23) in each of the other VOX circuits. This prevents a pulse output from NAND gate 49 and thereby deactivates the other VOX circuit(s) until the activated VOX circuit 13 is deactivated by a pause in speaking by the conferee at the location corresponding to the activated VOX circuit.

The VOX circuit 13 has only been described in regard to a schematic block diagram of the specific components thereof in view of the fact that all such components are of a conventional construction and, accordingly, the details of construction thereof form no part of the invention described herein.

While the invention has been shown and described with respect to a preferred embodiment thereof, it is not intended to be limited to any particular form shown and described. Accordingly, the appended claims are intended to cover all modifications within the spirit and scope of the invention described herein.

What I claim as new and desire to secure by Letters Patent of the United States is:

1. In a video communications system for remotely located conferees, a plurality of VOX circuits for controlling respective television cameras responsive to audio signals from respective speaking locations, each said VOX circuit including:

a. input audio level discriminator means for generating an output signal coincident with an input audio signal of equal or greater level than a selected threshold level;
   b. attack time control means responsive to the output of the audio level discriminator means for generating a set signal when the duration of the output of the audio level discriminator means exceeds a predetermined amount;
   c. audio duration control means responsive to the termination of the output of the audio level discriminator means for generating a clear signal delayed a selected time after said termination; and
   d. activation circuit means responsive to the set signal and the clear signal for activating a respective camera control means throughout the interval between the set signal and the clear signal.

2. The video communications system of claim 1 wherein each said VOX circuit includes a self-disabling means responsive to a lock-out signal from any of the other VOX circuits, and further includes means for generating a lock-out signal for disabling the other VOX circuits during said interval.

3. The video communication system of claim 1 wherein each said VOX circuit includes in the audio level discriminator means thereof a self-disabling means responsive to a lock-out signal from any of the other VOX circuits, and wherein each said VOX circuit includes in the activation circuit means thereof lock-out signal generating means for generating a lock-out signal adapted to disable the other VOX circuits during said interval.

* * * * *